United States Patent [19]
Loughmiller

[11] Patent Number: 5,727,001
[45] Date of Patent: Mar. 10, 1998

[54] CIRCUIT AND METHOD FOR TESTING AN INTEGRATED CIRCUIT

[75] Inventor: Daniel R. Loughmiller, Boise, Id.

[73] Assignee: Micron Technology, Inc., Boise, Id.

[21] Appl. No.: 698,207

[22] Filed: Aug. 14, 1996

[51] Int. Cl.[6] .................................................. G06F 11/00
[52] U.S. Cl. ....................................... 371/28; 365/201
[58] Field of Search ....................... 371/28, 21.1, 21.4;
365/201, 185.24, 189.09, 193, 189.05, 189.11;
395/183.18; 324/765, 76.11

[56] References Cited

U.S. PATENT DOCUMENTS

| | | | |
|---|---|---|---|
| 4,906,862 | 3/1990 | Itano et al. | 307/296.3 |
| 5,019,772 | 5/1991 | Dreibelbis et al. | 324/158 |
| 5,155,704 | 10/1992 | Walther et al. | 365/201 |
| 5,212,442 | 5/1993 | O'Toole et al. | 324/158 R |
| 5,231,605 | 7/1993 | Lee | 365/201 |
| 5,245,577 | 9/1993 | Duesman et al. | 365/201 |
| 5,248,075 | 9/1993 | Young et al. | 228/5.1 |
| 5,279,975 | 1/1994 | Devereaux et al. | 437/8 |
| 5,339,320 | 8/1994 | Fandrich et al. | 371/22.1 |
| 5,348,164 | 9/1994 | Heppler | 209/573 |
| 5,367,263 | 11/1994 | Ueda et al. | 324/537 |
| 5,373,472 | 12/1994 | Ohsawa | 365/201 |
| 5,384,533 | 1/1995 | Tokuda et al. | 324/158.1 |
| 5,384,741 | 1/1995 | Haraguchi et al. | 365/201 |
| 5,391,892 | 2/1995 | Devereaux et al. | 257/48 |
| 5,397,908 | 3/1995 | Dennison et al. | 257/306 |
| 5,420,869 | 5/1995 | Hatakeyama | 371/21.1 |
| 5,426,649 | 6/1995 | Blecha, Jr. | 371/22.1 |
| 5,440,241 | 8/1995 | King et al. | 324/765 |
| 5,440,517 | 8/1995 | Morgan et al. | 365/202 |
| 5,442,642 | 8/1995 | Ingalls et al. | 371/22.5 |
| 5,450,362 | 9/1995 | Matsuzaki | 365/201 |
| 5,452,253 | 9/1995 | Choi | 365/201 |
| 5,457,400 | 10/1995 | Ahmad et al. | 324/763 |
| 5,467,468 | 11/1995 | Koshikawa | 371/22.3 |
| 5,469,393 | 11/1995 | Thomann | 365/201 |
| 5,475,330 | 12/1995 | Watanabe et al. | 327/408 |
| 5,488,583 | 1/1996 | Ong et al. | 365/201 |
| 5,526,364 | 6/1996 | Roohparvar | 371/22.1 |
| 5,528,162 | 6/1996 | Sato | 324/765 |
| 5,528,603 | 6/1996 | Canella et al. | 371/25.1 |
| 5,541,935 | 7/1996 | Waterson | 371/22.5 |
| 5,544,108 | 8/1996 | Thomann | 365/201 |

*Primary Examiner*—Hoa T. Nguyen
*Assistant Examiner*—Nadeem Iqbal
*Attorney, Agent, or Firm*—Schwegman, Lundberg, Woessner & Kluth, P.A.

[57] ABSTRACT

A test mode detector (12a) that places a multi-pin integrated circuit (10) in test mode. The test mode detector (12a) comprises a pulse detector (25) that receives a control signal. The control signal controls when the integrated circuit (10) is in test mode. The test mode detector (12a) further includes a latch (27) that is responsive to the pulse detector (25) so as to set the latch (27) when the pulse detector (25) detects a pulse in the control signal that exceeds a threshold level. The latch provides a signal that places the integrated circuit (10) in test mode for a period of time that is greater than the duration of the pulse of the control signal.

20 Claims, 3 Drawing Sheets

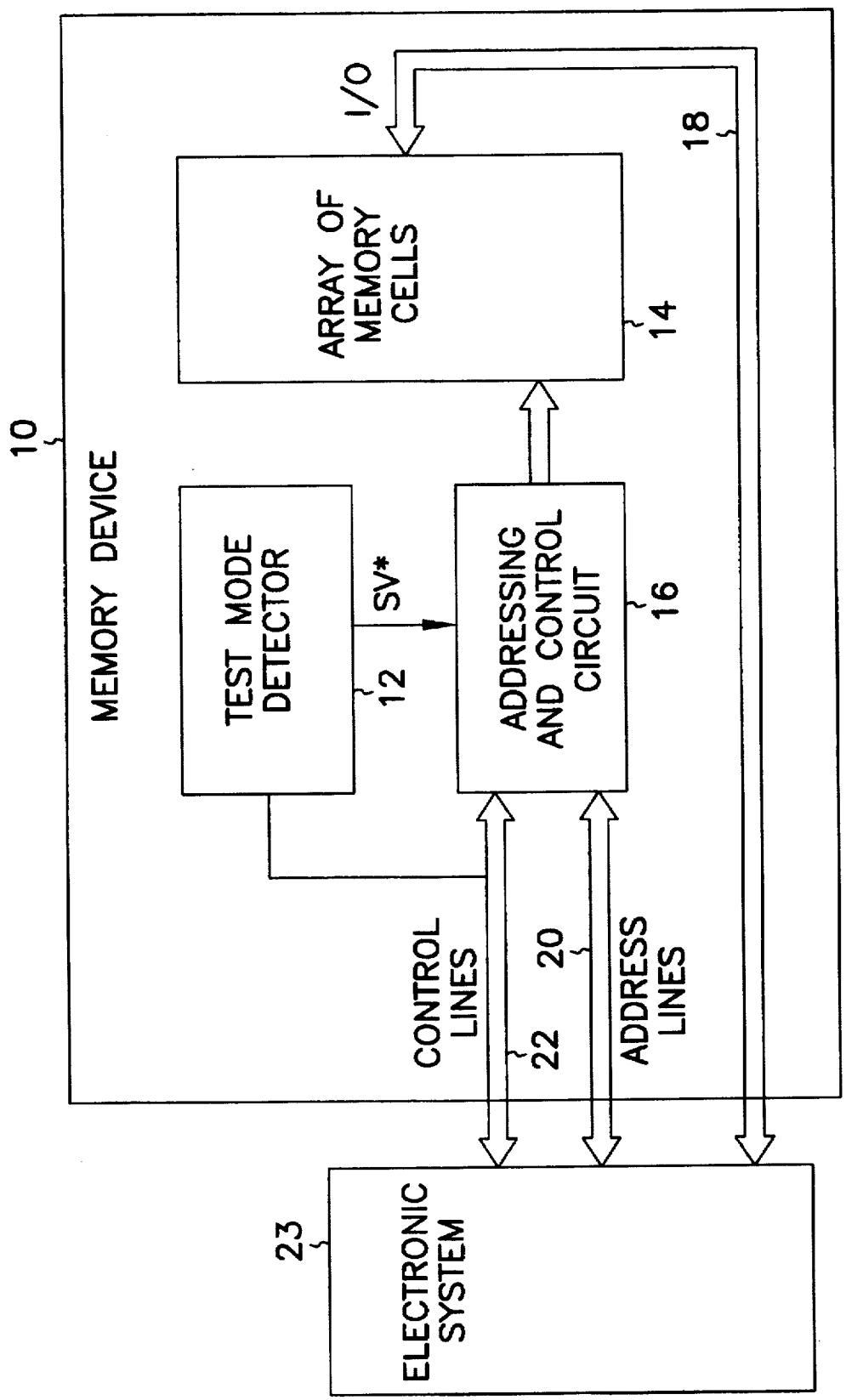

CIRCUIT AND METHOD FOR TESTING AN INTEGRATED CIRCUIT

This application is related to U.S. application Ser. No. 08/636,385, filed Apr. 16, 1996 and entitled "Circuit and Method for Testing an Integrated Circuit."

TECHNICAL FIELD OF THE INVENTION

The present invention relates generally to integrated circuits and, in particular, to a circuit and method for testing an integrated circuit.

BACKGROUND OF THE INVENTION

An integrated circuit comprises a large number of semiconductor devices, such as transistors, that are fabricated on a semiconductor substrate. Integrated circuits are produced in quantity on fabrication lines. Before an integrated circuit is sold, the manufacturer tests the integrated circuit for defects so that corrective action can be taken, if possible. To test the integrated circuit, the manufacturer applies test signals to selected pins of the integrated circuit. To speed up the process of testing large integrated circuits such as memory devices, the signals used to test the integrated circuit differ from the signals used in normal operation, even though the signals in both modes use the same pins of the integrated circuit. Therefore, designers have developed various techniques to differentiate test and normal modes of operation. Because this test mode should not be used once the chip successfully completes the tests, precautions must be taken to assure that the ultimate user of the integrated circuit cannot inadvertently activate the test mode.

In a typical dynamic random access memory (DRAM) device, a voltage that is above the power supply voltage for the integrated circuit, referred to as a super-voltage, is applied to a pin to place the device into test mode. Once in test mode, the manufacturer can test the operation of the memory device. To exit test mode, the super-voltage is removed from the pin. By using the super-voltage to enter test mode, it is unlikely that an end user will place the device in test mode inadvertently. As the size of integrated circuits gets smaller, the risk of damaging the integrated circuit due to dielectric and junction breakdown increases when a super-voltage is used.

For the reasons stated above, and for other reasons stated below which will become apparent to those skilled in the art upon reading and understanding the present specification, there is a need in the art for a circuit and method for entering test mode that reduces the risk of damage to the integrated circuit.

SUMMARY OF THE INVENTION

The above mentioned problems with testing of integrated circuits and other problems are addressed by the present invention and which will be understood by reading and studying the following specification. A circuit and method for testing integrated circuits is described which enters test mode based on a pulse in a control signal wherein the pulse provides a voltage that exceeds a threshold voltage for a period of time that is less than the duration of the testing. Advantageously, the circuit and method thus allow testing of the integrated circuit with reduced risk of shorting out components of the circuit as the size of the integrated circuits gets smaller.

In particular, one illustrative embodiment of the present invention provides a test mode detector that places a multi-pin integrated circuit, such as a dynamic random access memory (DRAM), in test mode. The test mode detector comprises a pulse detector that receives a control signal. The control signal controls when the integrated circuit is in test mode. The test mode detector further includes a latch that is responsive to the pulse detector so as to set the latch when the pulse detector detects a pulse in the control signal that exceeds a threshold level. The latch provides a signal that places the integrated circuit in test mode for a period of time that is greater than the duration of the pulse of the control signal.

BRIEF DESCRIPTION OF THE DRAWINGS

FIG. 1 is a block diagram of an illustrative embodiment of the present invention;

DETAILED DESCRIPTION OF THE INVENTION

Figure 2A:
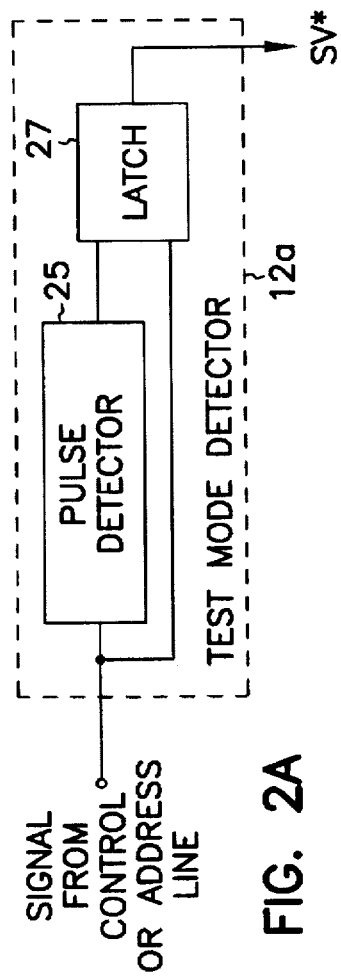
FIG. 2A is a block diagram of an illustrative embodiment of a test mode detector according to the teachings of the present invention.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

FIG. 1 is a block diagram of an illustrative embodiment of the present invention. Memory device 10 includes test mode detector 12 that switches memory device 10 between a normal operation mode and one or more test modes. Advantageously, test mode detector 12 responds to a signal that triggers the test mode of memory device 10 that reduces the risk of shorting out components of memory device 10 despite the trend toward smaller component devices in integrated circuits. Further, memory device 10 is designed such that in normal operation by an end user, memory device 10 will not inadvertently enter test mode.

Memory device 10 includes array of memory cells 14 constructed as known to a person of ordinary skill in the art. For example, memory device 10 may comprise a dynamic random access memory device (DRAM) or other appropriate integrated circuit that is capable of functioning in two modes, namely a test mode and a normal operation mode. Address and control circuit 16 is coupled to array 14. Array 14 provides and receives data over input/output (I/O) lines 18. Further, address lines 20 are coupled to address and control circuit 16 to provide the address of a cell in array 14 to be accessed for reading or writing data. Control lines 22 are also coupled to address and control circuit 16 to provide signals for controlling the operation of memory device 10. Control lines 22, address lines 20 and input/output lines 18 include pins of memory device 10 that are coupled to electronic system 23.

Figure 2B:
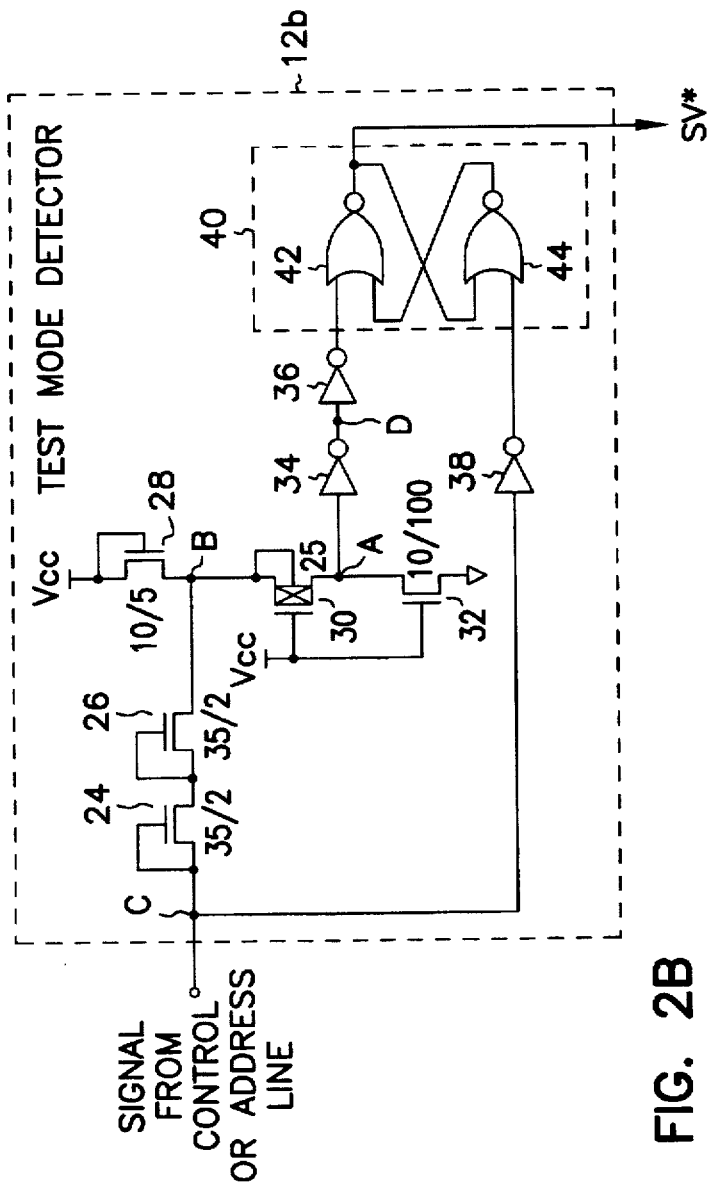
FIG. 2B is a schematic diagram of further illustrative embodiments of a test mode detector circuit according to the teachings of the present invention.

Test mode detector 12 is coupled to receive a control signal from electronic system 23. This control signal can be carried by one of control lines 22 or address lines 20, or other appropriate line that receives an input from electronic system 23. In the embodiment of FIG. 1, one of control lines 22 is coupled to test mode detector 12. In an alternative embodiment, one of address lines 20 could be used in place of the control line 22 to provide the control signal to test mode detector 12. For sake of clarity, the embodiments shown in FIGS. 1, 2A, and 2B are described in the context of the control signal being carried by one of control lines 22. The use of control lines 22 to provide the control signal to test mode detector 12 is shown by way of example and not by way of limitation. Electronic system 23 may comprise a testing system that provides signals to test the operation of memory device 10 in the test mode. Such systems are commonly used by manufacturers to test the performance of integrated circuits before they are shipped. Further, electronic system 23 may comprise a microprocessor based computer or other electronics system that uses memory device 10 in the normal operation mode. Test mode detector 12 uses the control signal from electronic system 23 to generate a signal, SV*. Test mode detector 12 is coupled to provide the SV* signal to address and control circuit 16. The SV* signal indicates whether address and control circuit 16 operates in test mode or normal operation mode.

In operation, memory device 10 receives control signals over control lines 22 from electronic system 23. Test mode detector 12 receives a signal from control lines 22 that indicates a desired mode of operation from electronic system 23. Test mode detector 12 places memory device 10 into test mode when the control signal rises to a voltage above a threshold voltage and maintains this value for a first period of time that is less than the period of the test mode. In one embodiment, the threshold voltage is a voltage that is above the normal power supply voltage of memory device 10. This is referred to as a "super-voltage." The threshold is advantageously outside of the normal operating range of memory device 10 so that an end user will not inadvertently place memory device 10 in test mode. Advantageously, test mode detector 12 can maintain memory device 10 in test mode longer than the duration of the time that the control signal exceeds the threshold. Thus, test mode detector 12 reduces the risk of damaging the other components of memory device 10 when in test mode.

FIG. 2A is a block diagram of an illustrative embodiment of a test mode detector, indicated generally at 12a. In this embodiment, test mode detector 12a comprises pulse detector 25 and latch 27. Pulse detector 25 is coupled to receive the input signal from control lines 22. Further, the output of pulse detector 25 is coupled to a first input of latch 27. The first input of latch 27 comprises a set input. A second input of latch 27 is coupled to receive the control signal from control line 22. The second input comprises a reset input for latch 27. Latch 27 produces the SV* signal at an output.

In operation, test mode detector 12a produces a signal, SV*, that selectively places memory device 10 in test mode. Pulse detector 25 receives a control signal from control line 22. Pulse detector 25 detects when the control signal exceeds a threshold voltage that indicates that the test mode has been selected by, for example, electronic system 23. Pulse detector 25 produces a corresponding signal and provides the signal to the first input of latch 27. The signal from pulse detector 25 sets the state of latch 27 such that latch 27 produces an output, SV*, that is a low logic level. This indicates that memory device 10 is to operate in test mode. When the testing is complete, the control signal is brought to a low logic level. The control signal causes latch 27 to reset and the output, SV*, returns to a high logic level.

FIG. 2B is a schematic diagram of another embodiment of a test mode detector, indicated generally at 12b, for use in memory device 10 of FIG. 1. Test mode detector 12b includes transistors 24 and 26 that are coupled to receive a signal from control line 22. Transistors 24 and 26 may comprise, for example, diode-coupled NMOS transistors coupled in series. A drain of transistor 24 is coupled to control line 22 at node C. A source of transistor 24 is coupled to a drain of transistor 26. A source of transistor 26 is coupled to node B. Transistors 24 and 26 each have a gate. The gate of transistor 24 is coupled to node C. The gate of transistor 26 is coupled to the source of transistor 24.

Test mode detector 12b also includes transistors 28, 30, and 32 that generate a voltage at node A that indicates when a super voltage has been applied at control line 22. A drain of transistor 28 is coupled to the voltage supply $V_{cc}$ and a source of transistor 28 is coupled to node B. Transistor 28 has a gate that is coupled to voltage supply $V_{cc}$. Transistor 30 is a PMOS transistor. A source of transistor 30 is coupled to node B and a drain of transistor 30 is coupled to node A. A drain of transistor 32 is coupled to node A. A source of transistor 32 is coupled to ground. Transistors 30 and 32 have gates coupled to a voltage supply $V_{cc}$. Transistor 32 is a long L device, e.g. the length of transistor 32 is much larger than the width of transistor 32 and thus its effect on the voltage of a node is easily overcome by another transistor. Exemplary width to length ratios for the transistors are shown in FIG. 2B next to the transistors. It is understood that these sizes are given by way of example and not by way of limitation.

Test mode detector 12b also includes inverters 34, 36 and 38 and a latch 40 that generate the output SV*. An input of inverter 34 is coupled to node A. Further, an output of inverter 34 is coupled to an input of inverter 36. An output of inverter 36 is coupled to a set input of latch 40. Furthermore, an input of inverter 38 is coupled to control line 22. An output of inverter 38 is coupled to the reset input of latch 40.

Latch 40 comprises, for example, an NOR gate 42 that receives a set input from inverter 36 and NOR gate 44. The reset input of NOR gate 44 is coupled to the output of NOR gate 42 and the output of inverter 38. The output from NOR gate 42 is output signal SV*.

Figure 3A:
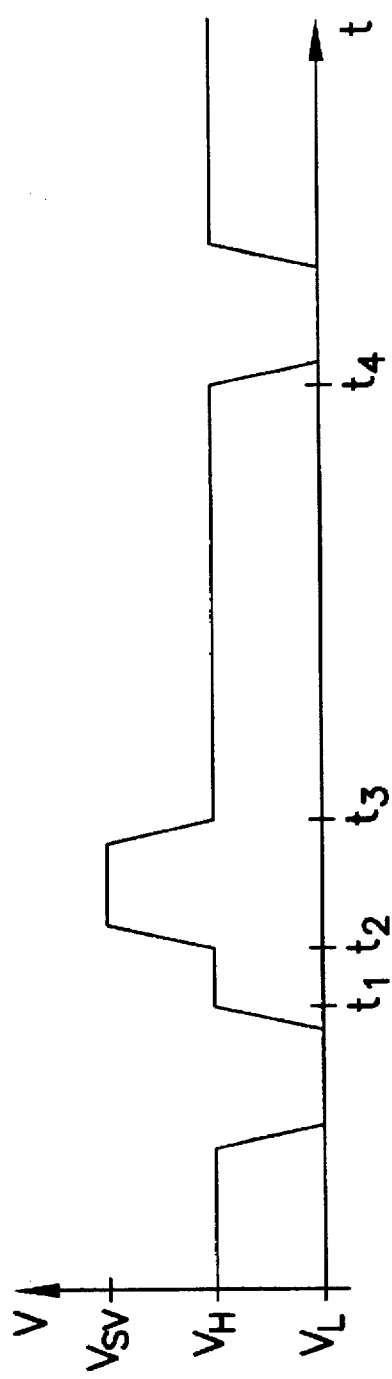
FIGS. 3A and 3B are timing diagrams illustrating the operation of the embodiment of FIG. 2B.
Figure 3B:
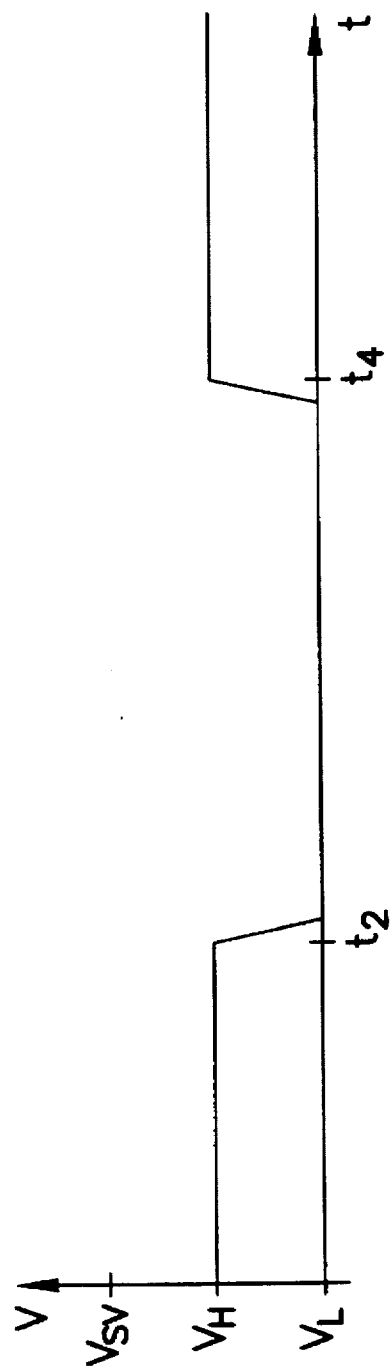

In operation at time $t_1$, as shown in FIG. 3A, transistor 24 receives a signal, $V_H$, from control line 22. The voltage supply $V_{cc}$ is received by transistor 28. At this time, transistor 28 is considered to be "on" because the voltage at the source of transistor 28 is below $V_{cc}$. At the source of transistor 28 the voltage is at least one threshold voltage below $V_{cc}$. For the purposes of this specification, the term "off" means that the transistor conducts an insignificant amount of current from drain to source. Conversely, the term "on" refers to a transistor that conducts more than an insignificant amount of current from drain to source. At this time transistors 24 and 26 are "off" due to insufficient voltage difference between node B and node C. Transistor 32 is "on" due to the voltage supply $V_{cc}$ applied at the gate of transistor 32. Transistor 30 is "off" due to the voltage $V_{cc}$ at the gate of transistor 30.

At time $t_2$ when the signal from control line 22 is changed to a super-voltage, $V_{SV}$, both transistors 24 and 26 are turned "on" due to the potential difference between node C and node B. The voltage at node B rises to a level above $V_{cc}$ approximately $V_{SV}-2V_T$, wherein $V_T$ is the threshold voltage for transistors 24 and 26. This causes transistor 28 to be turned "off" because the voltage at the source of transistor 28 is above $V_{cc}$. Transistor 30 starts to turn "on." Transistor 30 tries to pull node A to a high logic level. Because transistor 32 is a "long L device" transistor 30 overpowers transistor 32 and increases the voltage of the node A between transistor 30 and transistor 32. Inverter 34 inverts the voltage at node A and produces a low logic level at node D. Inverter 36 produces a high logic level for the set input of latch 40. Thus, NOR gate 42 produces a low output signal indicating that test mode is entered.

At time $t_3$, the signal from control line 22 returns to a high logic level, $V_H$. Once again, this causes both transistors 24 and 26 to be turned "off." Transistors 28, and 32 are turned "on". Node A goes to a low logic level and inverter 36 provides a low logic signal to the set input of latch 40. However, the output, SV*, stays the same. Inverter 38 still provides a low logic level to NOR gate 44. Since the SV* output was a low logic level at the time the output of inverter 36 changed states, NOR gate 44 still provides a high logic level to NOR gate 42. Thus, the output of NOR gate 42 is latched to a low logic level by bringing the control signal down from the supervoltage level, $V_{SV}$, to a high logic value, $V_H$.

At $t_4$, when the signal from control line 22 becomes a low logic level, $V_L$, inverter 38 provides a high logic level to the reset input of NOR gate 44. NOR gate 44 provides a low logic level to NOR gate 42. Thus, NOR gate 42 outputs a high logic level and the output, SV*, changes states indicating that the test mode of operation has ended.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, test mode detector 12 may be implemented with other types of latches and pulse detectors. Further, appropriate substitutions can be made to make SV* active at a high logic level rather than a low logic level. Finally, test mode detector 12 can be modified with a delay circuit so that glitches on the control line do not inadvertently place memory device 10 into test mode.

What is claimed is:

1. A method for testing an integrated circuit, the method comprising the steps of:
   raising a control signal for the integrated circuit to a voltage that exceeds a threshold level;
   entering test mode in response to the control signal;
   reducing the control signal to a second level that is below the threshold level during the test mode;
   testing the integrated circuit with test signals for a period of time that exceeds the time that the control signal exceeds the threshold level; and
   reducing the control signal to a third, different voltage level so as to exit the test mode.

2. The method of claim 1, wherein the step of raising the control signal comprises the step of raising the voltage of the control signal to a level above a high logic level for the integrated circuit.

3. The method of claim 1, wherein the step of reducing the control signal to a third, different voltage level comprises the step of reducing the control signal to a low logic level.

4. The method of claim 1, and further comprising the step of detecting when the control signal exceeds the threshold voltage with a pulse detection circuit.

5. The method of claim 4, and further comprising the step of setting a latch with the output of the pulse detection circuit when the control signal exceeds the threshold voltage.

6. The method of claim 5, and further comprising the step of resetting the latch when the control signal is reduced to the third, different voltage level.

7. A test mode detector that places an integrated circuit in test mode, the test mode detector comprising:
   a pulse detector that receives a control signal that indicates when the integrated circuit is in test mode; and
   a latch, responsive to the pulse detector, that is set when a pulse of the control signal exceeds a threshold voltage for a period of time that is less than the duration of the test mode so as to place the integrated circuit in test mode and that is reset by reducing the control signal to a third voltage level when testing is complete.

8. The test mode detector of claim 7, wherein the latch comprises a pair of cross-coupled NOR gates.

9. The test mode detector of claim 8, wherein the latch further comprises a set input that is coupled to the output of the pulse detector and a reset input that is coupled to receive the control signal through an inverter.

10. The test mode detector of claim 7, wherein the latch comprises a pair of cross-coupled NOR gates such that the latch outputs a low logic value when the latch is set in response to a pulse that indicates that the integrated circuit is to enter test mode.

11. The test mode detector of claim 7, wherein the pulse detector comprises first and second transistors with different channel types, the transistors are coupled such that during non-test mode operation, the first transistor maintains the output of the pulse detector at a first voltage level and during test mode operation, the second transistor forces the output of the pulse detector to a second voltage level, different from the first voltage level.

12. The test mode detector of claim 11, and further comprising a pair of inverters coupled between a common node of the transistors and a set input of the latch.

13. A memory device for an electronic system, comprising:
   an array of memory cells;
   an address and control circuit coupled to receive control and address signals from the electronic system for use in accessing the memory cells in the array;
   a test mode detector circuit responsive to a control signal from the electronic system, the test mode detector including:
   a pulse detector that receives a control signal that indicates when the integrated circuit is in test mode; and
   a latch, responsive to the pulse detector, that is set when a pulse of the control signal exceeds a threshold voltage for a period of time that is less than the duration of the test mode so as to place the integrated circuit in test mode and that is reset by reducing the control signal to a third voltage level when testing is complete.

14. The memory device of claim 13, wherein the latch comprises a pair of cross-coupled NOR gates.

15. The memory device of claim 14, wherein the latch further comprises a set input that is coupled to the output of the pulse detector and a reset input that is coupled to receive the control signal through an inverter.

16. The memory device of claim 13, wherein the latch comprises a pair of cross-coupled NOR gates such that the latch outputs a low logic value when the latch is set in response to a pulse indicating that the memory device is to be operated in test mode.

17. The memory device of claim 13, wherein the pulse detector comprises first and second transistors with different channel types, the transistors are coupled such that during non-test mode operation, the first transistor maintains the output of the pulse detector at a first voltage level and during test mode operation, the second transistor forces the output of the pulse detector to a second voltage level, different from the first voltage level.

18. The memory device of claim 17, and further comprising a pair of inverters coupled between a common node of the transistors and a set input of the latch.

19. The memory device of claim 13, wherein the array of memory cells comprises an array of cells in a dynamic random access memory device.

20. The memory device of claim 13, and further including a tester circuit coupled to provide the control and address signals and test signals to the memory device.

* * * * *